(12) United States Patent
Inai et al.

(10) Patent No.: US 7,012,286 B2
(45) Date of Patent: Mar. 14, 2006

(54) HETEROJUNCTION FIELD EFFECT TRANSISTOR

(75) Inventors: Makoto Inai, Nagaokakyo (JP); Hidehiko Sasaki, Nagaokakyo (JP)

(73) Assignee: Murata Manufacturing Co., Ltd., (JP)

( * ) Notice: Subject to any disclaimer, the term of this patent is extended or adjusted under 35 U.S.C. 154(b) by 0 days.

(21) Appl. No.: 10/255,407

(22) Filed: Sep. 26, 2002

(65) Prior Publication Data

US 2003/0057440 A1    Mar. 27, 2003

(30) Foreign Application Priority Data

Sep. 27, 2001 (JP) ............................ 2001-297966
Jul. 15, 2002 (JP) ............................ 2002-205911

(51) Int. Cl.
 H01L 31/0328 (2006.01)
 H01L 31/0336 (2006.01)
 H01L 31/072 (2006.01)
 H01L 31/109 (2006.01)

(52) U.S. Cl. .................. 257/192; 257/194; 257/183

(58) Field of Classification Search ............ 257/76–78, 257/183–201; 438/46, 47, 93
 See application file for complete search history.

(56) References Cited

U.S. PATENT DOCUMENTS

| | | | | |
|---|---|---|---|---|
| 5,686,741 | A * | 11/1997 | Ohori et al. ................. | 257/192 |
| 6,060,402 | A * | 5/2000 | Hanson ........................ | 438/745 |
| 6,180,968 | B1 * | 1/2001 | Kasahara et al. ............ | 257/192 |
| 6,294,446 | B1 * | 9/2001 | Ishikawa ...................... | 438/579 |
| 6,307,221 | B1 * | 10/2001 | Danzilio ...................... | 257/192 |
| 6,573,129 | B1 * | 6/2003 | Hoke et al. .................. | 438/167 |
| 6,627,473 | B1 * | 9/2003 | Oikawa et al. ............... | 438/46 |

FOREIGN PATENT DOCUMENTS

| | | |
|---|---|---|
| JP | 05-235041 | 9/1993 |
| JP | 06-104289 | 4/1994 |
| JP | 07-111327 | 4/1995 |
| JP | 9-321063 | 12/1997 |
| JP | 11-163316 | 6/1999 |
| JP | 11-251575 | 9/1999 |
| JP | 11-354544 | 12/1999 |
| WO | WO99/27586 | 6/1999 |

OTHER PUBLICATIONS

English Language Abstract of JP6-104289, Tanimoto Takuma et al, Semiconductor Device and Amplifier Circuit Wherein the Semiconductor Device is Used, Apr. 5, 1994.

* cited by examiner

Primary Examiner—Amir Zarabian
Assistant Examiner—Monica Lewis
(74) Attorney, Agent, or Firm—Ostrolenk, Faber, Gerb & Soffen, LLP

(57) ABSTRACT

A heterojunction field effect transistor operative from the micro wave band to the millimeter wave band has a gate recess structure formed in a manner such that its eye-empty areas have a significant effect on the voltage durability of the transistor. The eye-empty areas extend from a gate electrode to a source electrode as well as to a drain electrode and are formed by at least two material layers having different impurity concentrations, thereby making it possible to obtain an improved heterojunction field effect transistor having a reduced series resistance and an increased voltage durability.

10 Claims, 8 Drawing Sheets

FIG. 3B  THE PRESENT INVENTION

HETEROJUNCTION FIELD EFFECT TRANSISTOR

BACKGROUND OF THE INVENTION

1. Field of the Invention

The present invention relates to a semiconductor device involving a heterojunction, and more particularly to a heterojunction field effect transistor operative in the micro wave and millimeter wave bands.

2. Description of the Related Art

A highly electron-mobile transistor and a dope channel heterojunction field effect transistor, both of which are heterojunction field effect transistors, are used in the micro wave and millimeter wave bands. A cross sectional structure of a highly electron-mobile transistor is shown in FIG. 7.

The structure of the highly electron-mobile transistor shown in FIG. 7 includes in the following order a semi-insulating substrate 104, a buffer layer 105, a channel layer 106, a first barrier layer 107, a second barrier layer 108 and a contact layer 109. Formed on the upper surface of the contact layer 109 are a source electrode 102 and a drain electrode 103. The source electrode 102 and the drain electrode 103 are ohmic-joined with the contact layer 109. Further, a gate electrode 101 is formed on the second barrier layer 108 after selectively recess-etching the contact layer 109. Moreover, the highly electron-mobile transistor is protected by a protection film 111. Here, a recess portion formed between the gate electrode 101 and the source electrode 102, as well as a recess portion formed between the gate electrode 101 and the drain electrode 103, are each referred to as eye-empty areas (eye-empty areas 110 shown in FIG. 7) which serve as important portions providing a significance effect on the voltage durability of the heterojunction field effect transistor. Of course, the eye-empty areas 110 are formed by part of the contact layer 109.

The recess-etching processed shape of the heterojunction field effect transistor not only has a one-step recess structure shown in FIG. 7, but also have a two-step recess structure including two steps. FIG. 8 shows as an example a cross sectional structure of a highly electron-mobile transistor having a two-step recess structure.

However, with regard to the one-step recess structure shown as a conventional structure in FIG. 7, since the contact layer 109 forms an ohmic-junction with the source electrode 102 and the drain electrode 103, it is formed by an n-type GaAs layer having a high dopant concentration. Further, as described above, since the eye-empty areas 110 are formed by the contact layer 109, the eye-empty areas 110 also have a high dopant concentration, exhibiting a high carrier concentration. For this reason, when an electric field is applied to an area formed between the gate electrode 101 and the source electrode 102 as well as to an area formed between the gate electrode 101 and the drain electrode 103, centralized in the eye-empty areas 110, the carrier concentration of the eye-empty areas 110 is relatively high, forming a weak insulating strength, hence causing a breakdown in a low electric field.

As a measure for inhibiting a breakdown in a low electric field, there has been in use the aforesaid two-step recess structure shown in FIG. 8. As shown in FIG. 8, the transistor having the two-step recess structure comprises in the following order a semi-insulating substrate 124, a buffer layer 125, a channel layer 126, a first barrier layer 127, a second barrier layer 128, and a contact layer 130. Further, a connection layer 129 consisting of an n-type GaAs having a low dopant concentration is formed between the contact layer 130 and the second barrier layer 128. In this structure, a path extending from the gate electrode 121 to the drain electrode 123 as well as other paths extending from the source electrode 122 and the gate electrode 121 to the drain electrode 123, are all formed into a two-step structure. As a result, an applied electric field can be dispersed into several portions based on the plurality of steps, obtaining an effect that an electric field applied to each step of a multi-step structure is smaller than that applied to a one-step recess structure, thereby enabling the transistor to have an improved voltage durability.

In addition, since the connection layer 129 is formed by an n-type GaAs layer having a low dopant concentration, an insulating capability of the eye-empty areas 132 is increased, so that the transistor has an improved voltage durability.

However, with the above-described arrangement, the connection layer 129 formed by an n-type GaAs layer having a low dopant concentration has a low carrier concentration and thus has an undesirably increased resistance. Moreover, since a surface depletion layer that occurs on the surface of the eye-empty areas 132 become large, the high resistance of the eye-empty areas is further enhanced. For the reasons described above, since an electric current path extending from the drain electrode to the source electrode becomes narrow, there is a problem that a series resistance of the heterojunction field effect transistor is increased. Moreover, since the surface depletion layers that occur on the surfaces of the eye-empty areas 132 are formed uniformly, once an electric field is applied to an area formed between the gate electrode 121 and the source electrode 122, as well as to an area formed between the gate electrode 121 and the drain electrode 123, the electric field will be centralized on some corner portions, such as the gate electrode end and the recess processing end portions in the eye-empty areas 132 (on which surface depletion layers have already occurred). Hence it causes the heterojunction field effect transistor to have a deteriorated voltage durability.

In particular, an increased series resistance of the heterojunction field effect transistor as well as a decreased voltage durability thereof are the most significant factors responsible for some deteriorated characteristics of an oscillator and a power amplifier which are required to have a high gain, a high output and a high efficiency and operative from the micro wave band to the millimeter wave.

SUMMARY OF THE INVENTION

In order to overcome the problems described above, preferred embodiments of the present invention provide an improved heterojunction field effect transistor having a high voltage durability and a small series resistance during its operation, thereby solving the aforementioned problems existing in the above-discussed conventional structures.

According to a preferred embodiment of the present invention, the heterojunction field effect transistor has a one-step gate recess structure which comprises a gate electrode, a recess adjacent the gate electrode and a contact layer. Eye-empty areas extend in the lateral direction of the gate electrode from the gate electrode side to an upper end of a side wall of the recess, and also extend in a transverse direction of the gate electrode from the low end of the gate electrode to an upper end of the contact layer. The eye-empty areas are formed by at least two material layers having different impurity concentrations.

Further, according to another preferred embodiment of the present invention, the heterojunction field effect transistor has a two-step gate recess structure comprising a gate electrode, and a first recess adjacent the gate electrode, a second recess adjacent the first recess and a contact layer. Eye-empty areas extend in a transverse direction of the gate electrode from the gate electrode side to a lower end of a side wall of the first recess, and also extend in a transverse direction of the gate electrode from the low end of the gate electrode to the bottom of the first recess. The eye-empty areas are formed by at least two material layers having different impurity concentrations.

Since the eye-empty areas are formed by a plurality of material layers having different impurity concentrations, surface depletion layers of different sizes occur on the respective layers forming the eye-empty areas. As a result, since these surface depletion layers will deform, it becomes possible to disperse portions on which electric fields are centralized. In this way, it becomes possible to prevent a high resistance of the eye-empty areas and the narrowness of the channels, thereby providing an improved heterojunction field effect transistor having high voltage durability.

Furthermore, each heterojunction field effect transistor of the present invention is formed such that its eye-empty areas extend from the gate electrode to the source electrode as well as to the drain electrode. Therefore, it is possible for the heterojunction field effect transistor to obtain high voltage durability. In addition, it is possible to inhibit an enlargement of the surface depletion layers of the eye-empty areas, thus inhibiting an increase of the series resistance of the heterojunction field effect transistor.

Further, since a material having a low impurity concentration is used to form the end of the gate electrode and the recess processing end portions (all of which form corner portions in the eye-empty areas and on which electric fields are centralized), it becomes possible to inhibit the centralization of electric field on these corner portions in the eye-empty areas.

In this way, it becomes possible to provide an improved heterojunction field effect transistor having high voltage durability and a low series resistance. Therefore, an oscillator and a power amplifier, which are operative from an area of micro wave to an area of millimeter wave, can obtain a high gain, a high output and a high efficiency, thereby ensuring a higher reliability.

Other feature, elements, characteristics and advantages of the present invention will become more apparent from the following detailed description of preferred embodiments of the present invention with reference to the attached drawings.

BRIEF DESCRIPTION OF THE DRAWING(S)

FIGS. 3A and 3B are graphs showing a comparison in leak current between the present invention and a conventional heterojunction field effect transistor.

DESCRIPTION OF THE PREFERRED EMBODIMENTS

Figure 1:
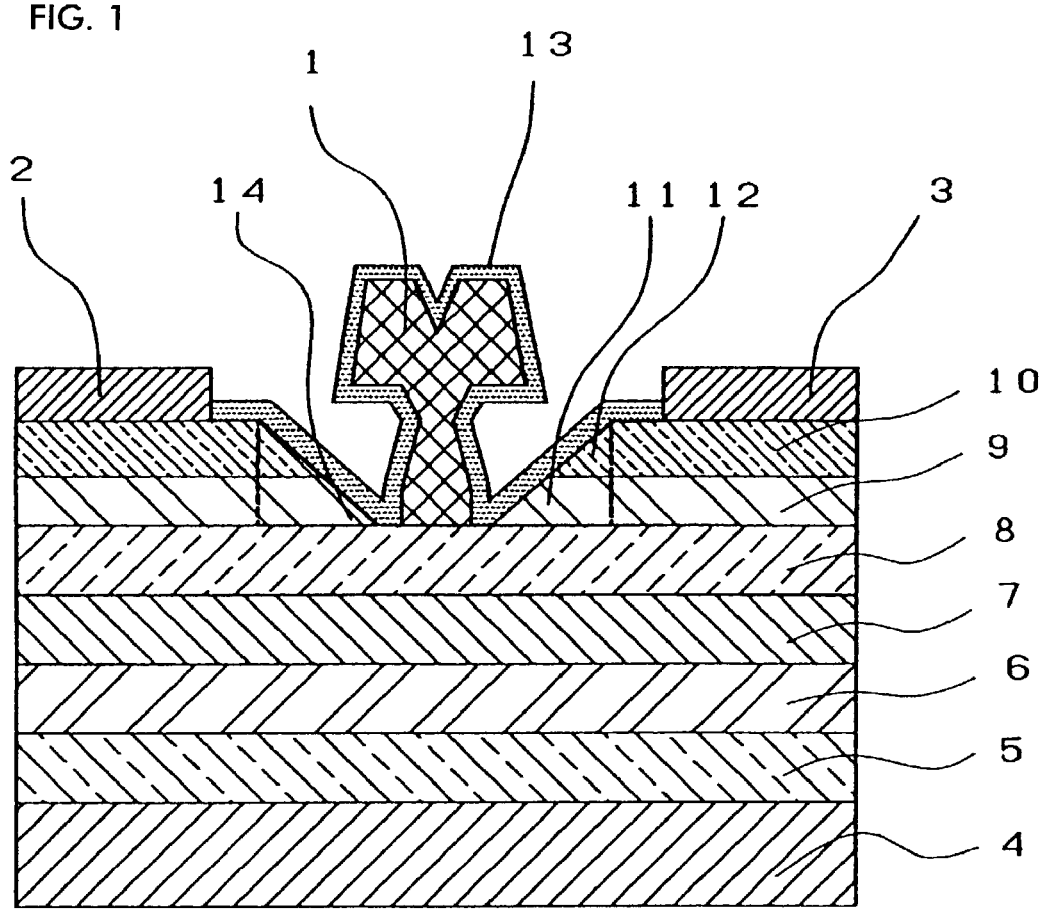
FIG. 1 is a cross sectional view showing a heterojunction field effect transistor formed according to a first embodiment of the present invention.

[First Embodiment, FIG. 1]

In the following, description will be given to explain a heterojunction field effect transistor formed according to a first embodiment of the present invention, with reference to FIG. 1.

As shown in FIG. 1, a heterojunction field effect transistor having a one-step recess structure includes successively in the following order a semi-insulating substrate 4, a buffer layer 5, a channel layer 6, a first barrier layer 7, a second barrier layer 8, a lower contact layer 9 and a contact layer 10. In practice, these layers are all formed by an epitaxial growing method involving an MBE process or an MOCVD process and the like. Further, formed on the upper surface of the contact layer 10 are a source electrode 2 and a drain electrode 3. Here, the contact layer 10 forms an ohmic junction with the source electrode 2 and the drain electrode 3. Moreover, the contact layer 10 and the lower contact layer 9 are selectively recess-etched in their portions located between the source electrode 2 and the drain electrode 3, thereby forming a recess and thus partially exposing the second barrier layer 8. Then, a gate electrode 1 is attached to the second barrier layer's exposed portion serving as the bottom of the recess. Specifically, those portions removed by recess etching the contact layer 10 and the lower contact layer 9 have been formed into a tapered shape. Furthermore, as shown in FIG. 1, such a heterojunction field effect transistor is protected by a protection layer 13 consisting of SiN or the like.

Meanwhile, eye-empty areas extending in the lateral direction (in the horizontal direction extending from the gate electrode to the drain electrode or the source electrode) from the gate electrode 1 to an upper end of a side wall of the recess groove, and also extending in the longitudinal direction (in the thickness direction of the respective layers) from an upper end of the contact layer to a lower end of the gate electrode 1, include a first eye-empty area 11 formed by part of the lower contact layer 9 and a second eye-empty area 12 formed by part of the contact layer 10.

Here, the first eye-empty area 11 is formed by the same material as that forming the lower contact layer 9, which is an n-type GaAs layer having a low concentration. The second eye-empty area 12 is formed by the same material as that forming the contact layer 10, which is an n-type GaAs layer which has a high concentration. In this way, a surface depletion layer occurring in the first eye-empty area 11 is relatively large, while a surface depletion layer occurring in the second eye-empty area 12 is relatively small. Accordingly, convex and concave portions are formed on the surface depletion layers in the eye-empty areas, so that it is possible to form a plurality of portions each being easy to collect an electric field, besides a corner portion 14 (capable of collecting electric fields) of the first eye-empty area 11. As a result, it is possible to disperse a large electric field into several small electric fields, thereby enabling the heterojunction field effect transistor to improve voltage durability. Further, since the eye-empty areas contain a low concentration n-type GaAs layer and a high concentration n-type GaAs layer which are mixed together within these areas, it is possible to inhibit an enlargement of the surface depletion layers of the eye-empty areas, thereby making it possible to inhibit an increase of the series resistance of the heterojunction field effect transistor.

Besides GaAs material, the lower contact layer 9 forming the first eye-empty area 11 can also be formed by other materials having a low impurity concentration. For example, it is allowed to use InGaP, InGaAlP and InGaAlAs. Similarly, the contact layer 10 forming the second eye-empty area 12 can also be formed by another material having a high impurity concentration, i.e., having the same impurity concentration as that of the high concentration n-type GaAs.

Here, the semi-insulating substrate 4 is a GaAs substrate or a InP substrate.

The buffer layer 5 is formed by a non-doped layer, but it can also be formed by a thin n-type layer or a thin p-type layer. Further, the buffer layer 5 may also be formed by GaAs, or it can be formed by AlGaAs or InAlAs. In addition, it is also possible to use a layer formed by containing two or more of the above materials or to use a general layer having a super-lattice structure.

The channel layer 6 is an n-type doped layer or a non-doped layer formed by using an n-type InGaAs, but it can also be formed by combining together these two layers or can be formed by a GaAs layer.

The first barrier layer 7 and the second barrier layer 8 are formed by using AlGaAs, but they can also be formed by using other materials, such as InGaP and InAlAs. Further, the conducting type of the barrier layers is such that the first barrier layer 7 is an n-type and the second barrier layer 8 is a non-doped layer. However, these barrier layers can also be formed into an n-type layer or a non-doped layer (all having a one-layer structure).

Figure 2:
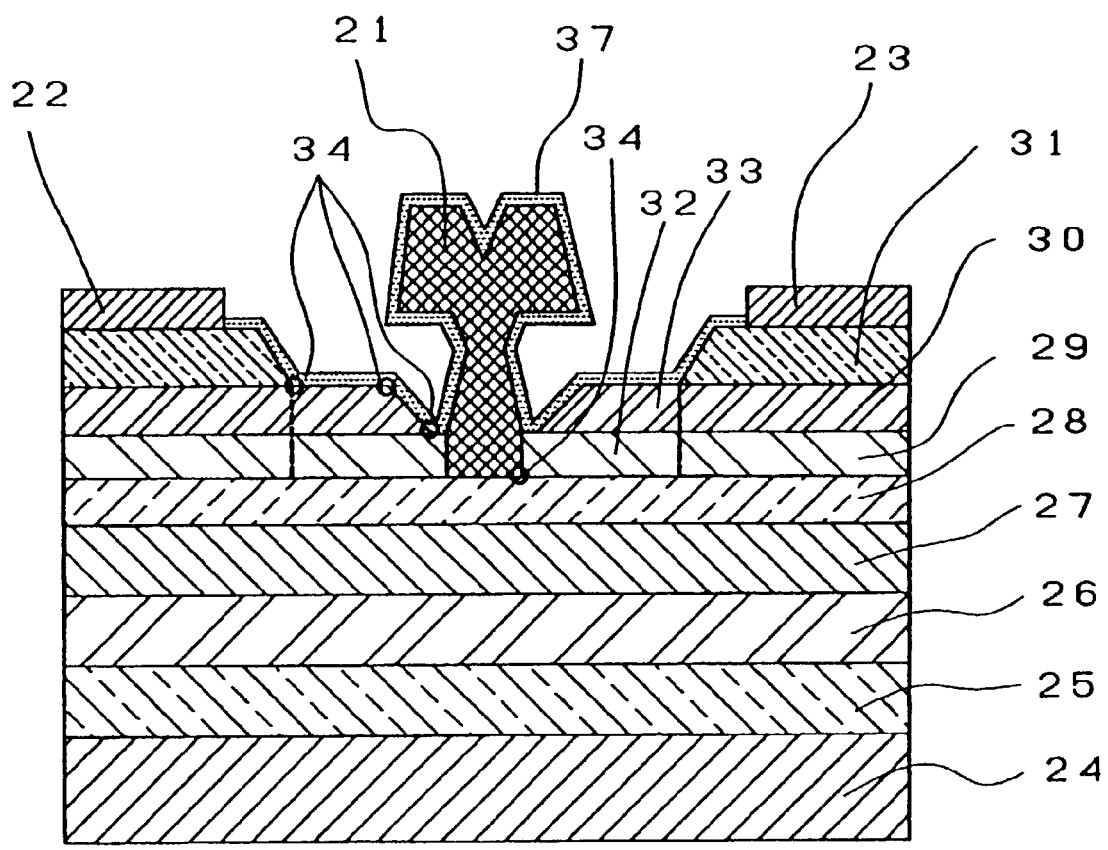
FIG. 2 is a cross sectional view showing a heterojunction field effect transistor formed according to a second embodiment of the present invention.

[Second Embodiment, FIG. 2]

Next, description will be given to explain a heterojunction field effect transistor formed according to a second embodiment of the present invention, with reference to FIG. 2.

As shown in FIG. 2, a heterojunction field effect transistor having a two-step recess structure includes successively in the following order a semi-insulating substrate 24, a buffer layer 25, a channel layer 26, a first barrier layer 27, a second barrier layer 28, a low connection layer 29, an upper connection layer 30 and a contact layer 31. In practice, these layers are all formed by an epitaxial growing method involving an MBE process and an MOCVD process and the like. In fact, the materials forming the transistor in the second embodiment are almost the same as those used in the first embodiment, except that the lower connection layer 29 is formed by a high concentration n-type GaAs and the upper connection layer 30 is formed by a low concentration n-type GaAs.

The second embodiment differs from the first embodiment in that the second embodiment involves a two-step recess structure. Such two-step recess structure may be formed in the following process. Namely, firstly, a large part of the contact layer 31 corresponding to an area located between the source electrode 22 and the drain electrode 23 is recess-etched so as to form a first recess. Secondly, a central portion of the etched area of the contact layer is re-etched so as to form a second recess. Subsequently, a gate electrode 21 is attached so as to bury its lower end into the lower connection layer 29.

Furthermore, as shown in FIG. 2, such a heterojunction field effect transistor is protected by a protection layer 37 consisting of SiN or the like.

In this way, the two-step recess structure is formed by two paths, with one extending between the gate electrode 21 and the source electrode 22 and the other between the gate electrode 21 and the drain electrode 23, and with each path being in a two-step structure. Accordingly, an applied electric field can be dispersed into a plurality of smaller fields on a plurality of different steps, rendering each electric field applied to each step of the two-step structure smaller than that applied to a one-step recess structure, thus making it possible to ensure an improved voltage durability for the transistor, i.e., obtaining a higher voltage durability than that of the one-step recess structure formed according to the first embodiment.

Here, the eye-empty areas extending in the lateral direction from the gate electrode 21 to the lower end of the side wall of the first recess, and extending in the longitudinal or thickness direction from the lower end of the gate electrode 21 to the bottom of the first recess, include a first eye-empty area 32 and a second eye-empty area 33. In detail, the first eye-empty area 32 is formed by part of the lower connection layer 29 consisting of n-type AlGaAs having a low concentration which is for example $5 \times 10^{17}$ to $2 \times 10^{18}$ cm$^{-3}$, while the second eye-empty area 33 is formed by part of the upper connection layer 30 consisting of n-type GaAs having a high concentration which is for example $1 \times 10^{18}$ to $3 \times 10^{18}$ cm$^{-3}$. As a result, a Schottky depletion layer occurring in the first eye-empty area 32 is relatively large, while a depletion layer occurring in the second eye-empty area 33 is relatively small. If the above concentration relationship between the two eye-empty areas is inverted, the large and small relationship between the two depletion layers will also be inverted. For this reason, the depletion layers within the eye-empty areas will be uneven with respect to each other. In view of this, since it is possible to produce a plurality of portions easy to collect electric field except for the eye-empty area's corner portions 34 on which electric fields are centralized, it is possible to disperse an electric field, thereby enabling the heterojunction field effect transistor to obtain an improved voltage durability. Namely, there is not only the modulation of the surface shapes of the electric field applying portions (depending on the two-step recess structure), but also the modulation of the thickness of the depletion layers of the electric field applying portions, so that it is possible to further disperse the centralization of the electric fields, to reduce the field strength applied to each unit area, thereby improving the voltage durability of the transistor.

Furthermore, since the second eye-empty area 33 is formed by GaAs layer having a low concentration, it is allowed to reduce the surface depletion layer in the second eye-empty area 33, making it possible to prevent the formation of a high resistance of the eye-empty area, also to prevent the formation of narrow channels. On the other hand, even if the second eye-empty area 33 is formed by GaAs having a high concentration, it is still possible to obtain the similar results.

Figure 3A:
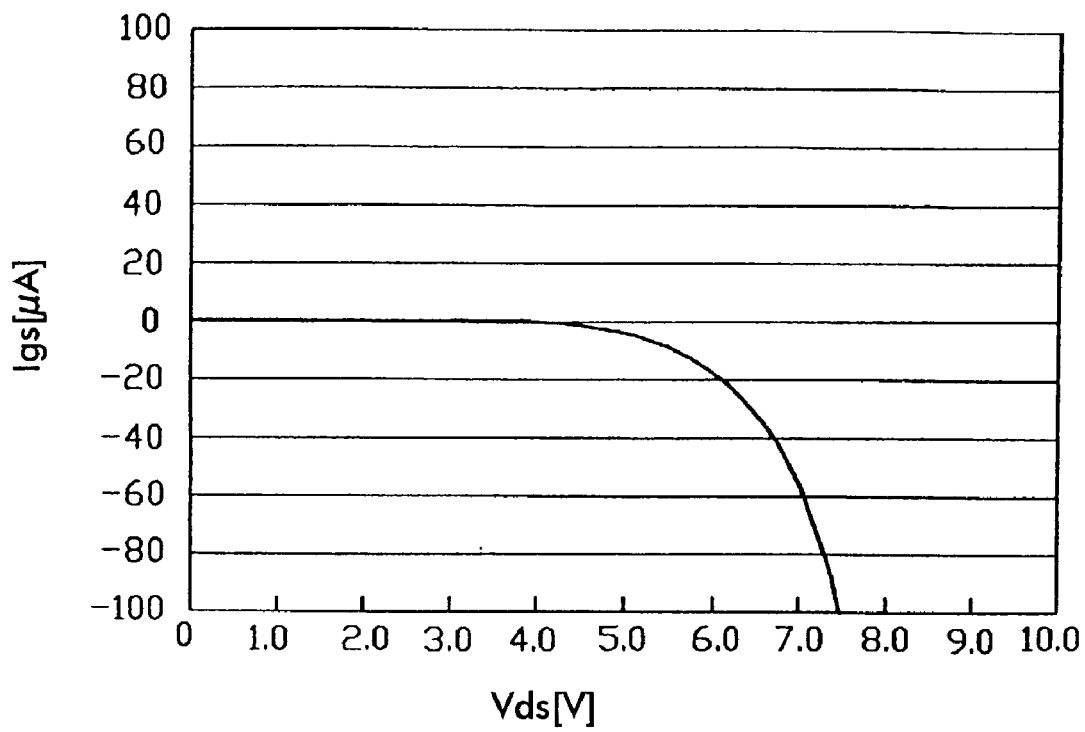
Figure 3A:
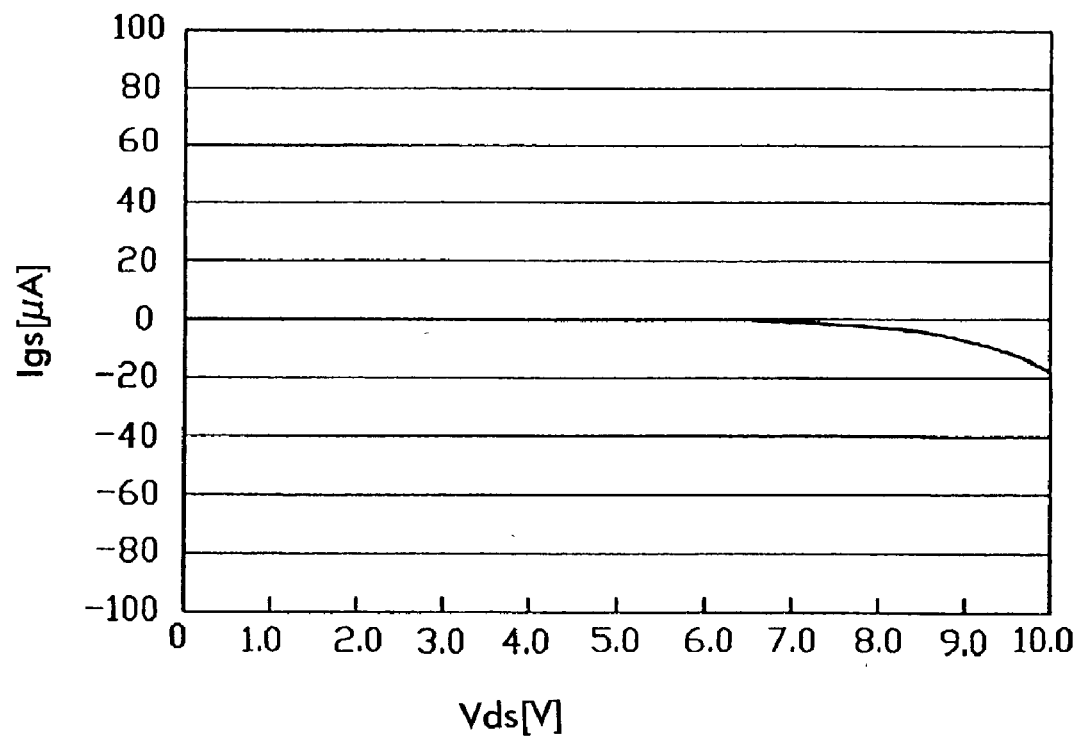
Figure 8:
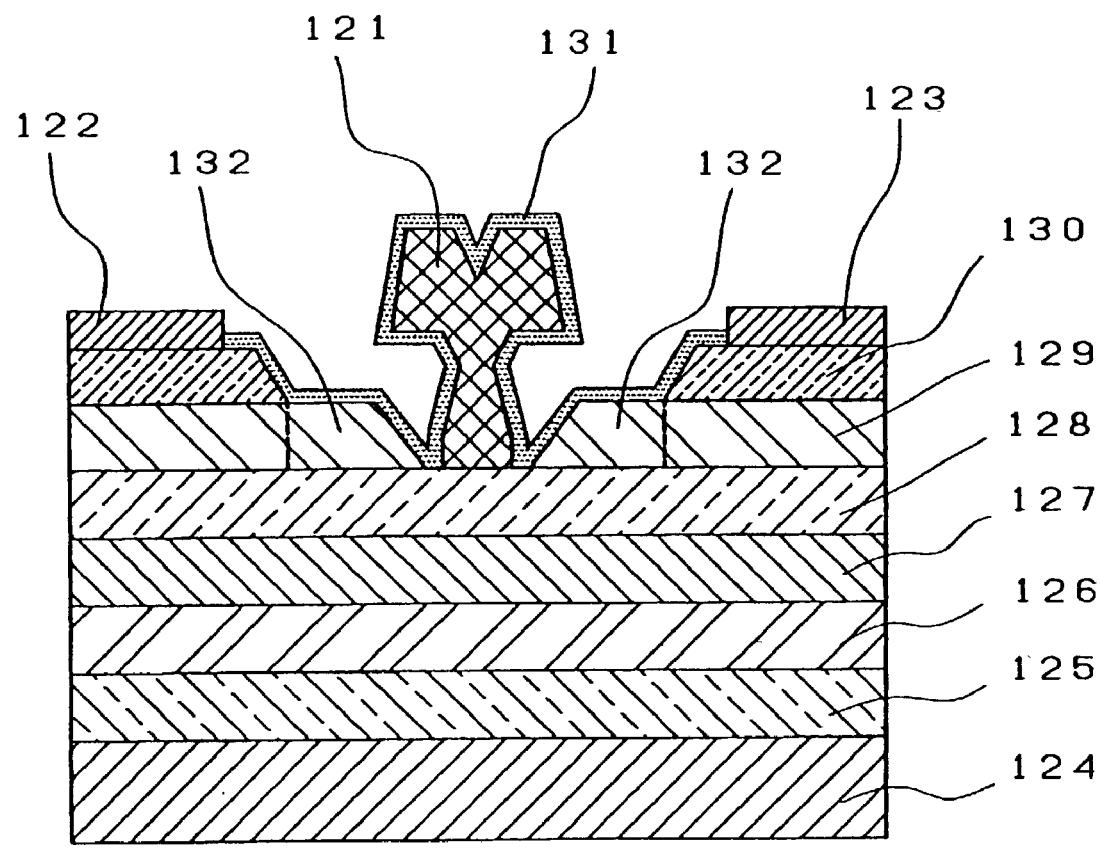
FIG. 8 is a cross sectional view showing a conventional heterojunction field effect transistor having a two-step recess structure.

FIG. 3 shows two graphs showing a comparison in electric characteristics between the heterojunction field effect transistor formed according to the second embodiment (having a two-step recess structure shown in FIG. 2) and the conventional heterojunction field effect transistor (having a two-step recess structure shown in FIG. 8). In more detail, FIG. 3A shows an Igs-Vd characteristics of the conventional heterojunction field effect transistor. As shown in the graph, when a drain voltage Vd is 5V or higher, a gate source current Igs (leak current) will increase, hence causing a breakdown. In contrast, the characteristics of the heterojunction field effect transistor of the present invention are such that even if the drain voltage Vd is in the vicinity of 6.5 V, the gate source current Igs (leak current) does not increase, as shown in FIG. 3B. Therefore, it is understood that the heterojunction field effect transistor of the present invention has clearly more improved voltage durability than the above-described conventional transistor.

Figure 4:
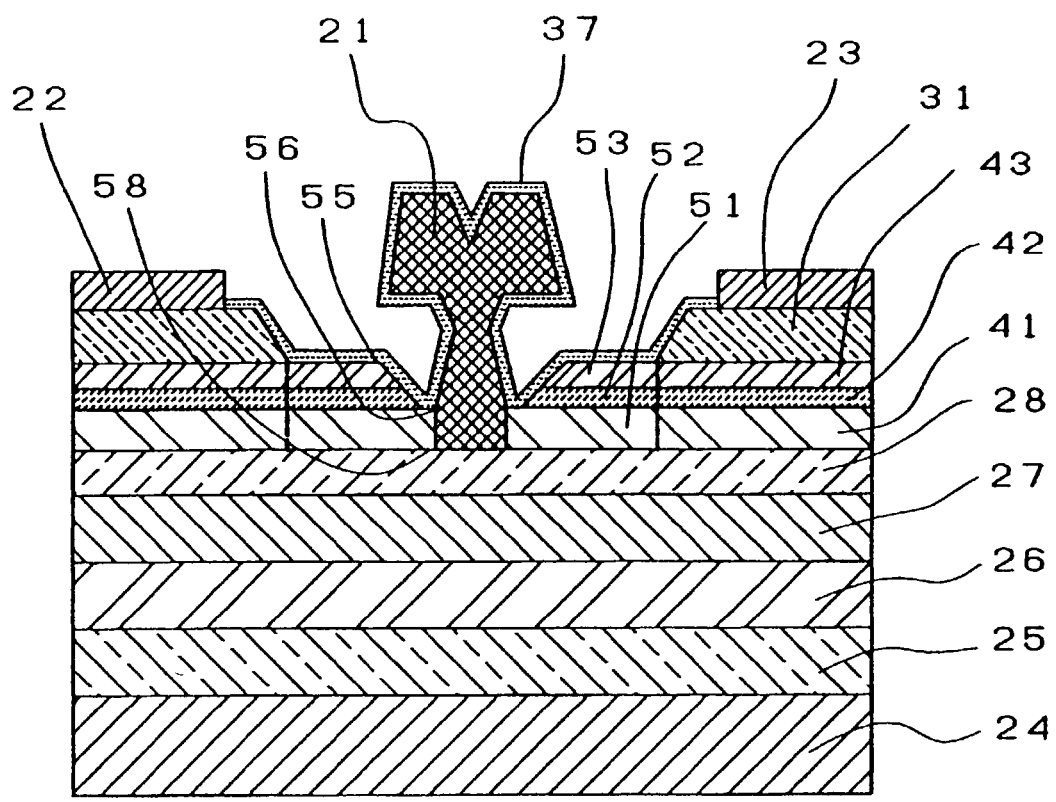
FIG. 4 is a cross sectional view showing a heterojunction field effect transistor formed according to a third embodiment of the present invention.

[Third Embodiment, FIG. 4]

In the following, description will be given to explain a heterojunction field effect transistor formed according to a third embodiment of the present invention, with reference to FIG. 4.

As shown in FIG. 4, a heterojunction field effect transistor having a two-step recess structure is almost the same as the heterojunction field effect transistor formed according to the second embodiment, except that the eye-empty areas have a three-layer structure. Referring again to FIG. 4, the eye-empty areas include a first eye-empty area 51, a second eye-empty area 52 and a third eye-empty area 53. In detail, the first eye-empty area 51 is formed by part of a first connection layer 41 consisting of n-type AlGaAs having a low concentration which is for example $5\times10^{17}$ to $2\times10^{18}$ cm$^{-3}$, the second eye-empty area 52 is formed by part of a second connection layer 42 consisting of n-type GaAs having a high concentration which is for example $2\times10^{18}$ to $5\times10^{18}$ cm$^{-3}$, while the third eye-empty layer 53 is formed by part of a third connection layer 43 consisting of n-type GaAs having a low concentration. In this way, a Schottky depletion layer occurring in the first eye-empty area 51 is relatively large, while a depletion layer occurring in the second eye-empty area 52 is relatively small, and a depletion layer occurring in the third eye-empty area 53 is further small. Consequently, the thickness of the depletion layers within the eye-empty areas varies between the gate and the drain (source). At this time, corner portions are relatively thick in the vicinity of the gate in which electric field is easy to be centralized, but will be thinner farther away from the gate. As a result, since it is possible to produce a plurality of portions easy to collect electric field except for the eye-empty area's corner portions 55, 56 and the gate electrode end portion 58 to which electric fields will be centralized by virtue of the two-step recess structure, it is possible to disperse an electric field, thereby enabling the heterojunction field effect transistor to obtain a further improved voltage durability than the above-described second embodiment.

Further, even when the first eye-empty area 51 and the third eye-empty area 53 involving the corner portions 55, 56 and the gate electrode end 58 (to which electric fields are centralized by virtue of the two-step recess structure) are formed by a low concentration n-type AlGaAs layer and a low concentration n-type GaAs layer (which are all low impurity concentration layers), and even when the second eye-empty area 52 (containing no portion for centralizing an electric field) is formed by an n-type GaAs layer, it is still possible to perform the modulation of the depletion layers within the eye-empty areas, and to enable an electric field to be more easily centralized in a high concentration eye-empty area than in a low concentration eye-empty area, thereby making it possible to further disperse the electric field to the corner portions 55, 56 and the gate electrode end 58 of the eye-empty areas.

Further, since a high concentration n-type GaAs layer is used, it is possible to inhibit an undesired enlargement of the surface depletion layers of the eye-empty areas, thus inhibiting an undesired increase of the series resistance of the heterojunction field effect transistor.

Figure 5:
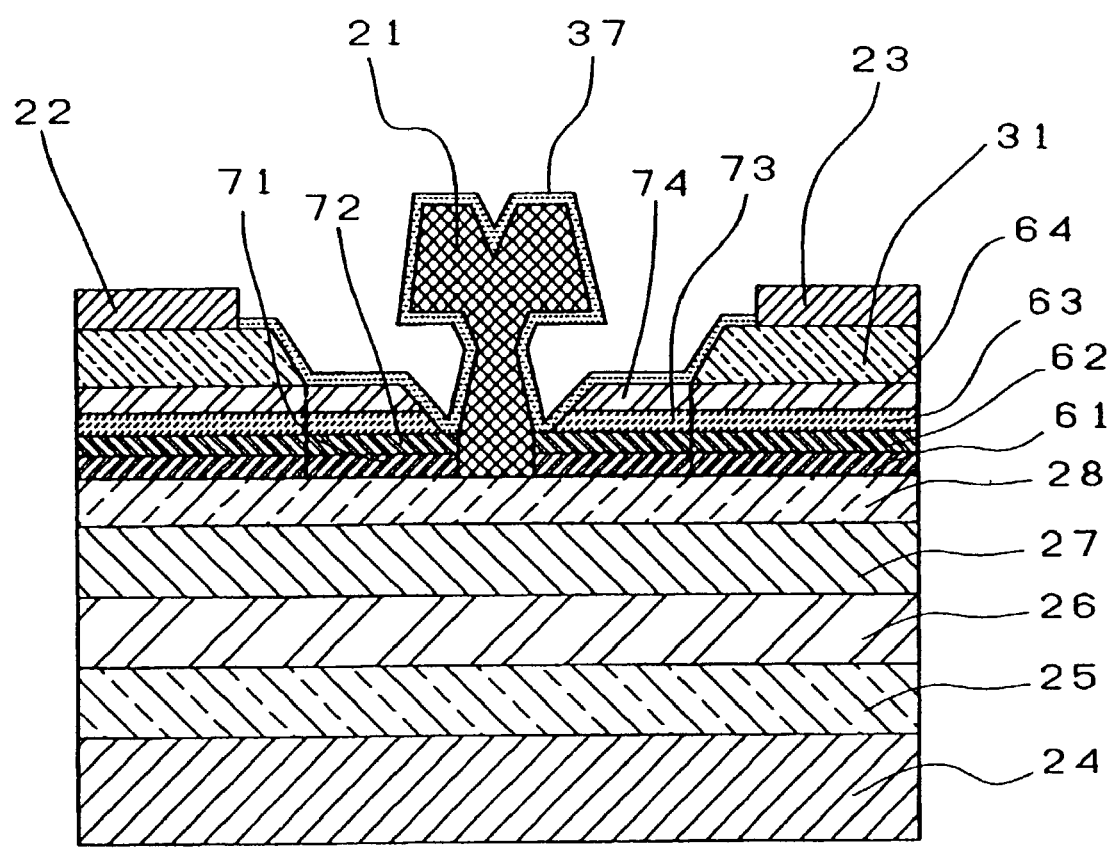
FIG. 5 is a cross sectional view showing a heterojunction field effect transistor formed according to a fourth embodiment of the present invention.

[Fourth Embodiment, FIG. 5]

In the following, description will be given to explain a heterojunction field effect transistor formed according to a fourth embodiment of the present invention, with reference to FIG. 5.

As shown in FIG. 5, a heterojunction field effect transistor of the fourth embodiment is almost the same as the heterojunction field effect transistor formed according to the third embodiment, except that the eye-empty areas have a four-layer structure. Referring again to FIG. 5, the eye-empty areas include a first eye-empty area 71, a second eye-empty area 72, a third eye-empty area 73 and a fourth eye-empty area 74. In detail, the first eye-empty area 71 is formed by part of a first connection layer 61 consisting of n-type AlGaAs, the second eye-empty area 72 is formed by part of a second connection layer 62 consisting of n-type AlGaAs having a low concentration, the third eye-empty area 73 is formed by part of a third connection layer 63 consisting of n-type GaAs, the fourth eye-empty area 74 is formed by part of a fourth connection layer 64 consisting of n-type GaAs having a low concentration. In this way, a depletion layer occurring in the first eye-empty area 71 is relatively small, a depletion layer occurring in the second eye-empty area 72 is relatively large, a depletion layer occurring in the third eye-empty area 73 is relatively small, and a depletion layer occurring in the fourth eye-empty area 74 is relatively large. Accordingly, since the shape of the depletion layers of the eye-empty areas in the fourth embodiment involves much more convex and concave portions than the third embodiment, it is possible to produce much more portions easy to centralize electric field than the third embodiment. Therefore, it is possible to more effectively disperse an electric field, thus enabling the heterojunction field effect transistor to obtain further improved voltage durability than that obtained in the above-described third embodiment.

Further, since an n-type AlGaAs layer, n-type GaAs layer and n-type AlGaAs layer are mixed together in the eye-empty areas, it is possible to inhibit an undesired enlargement of the surface depletion layers of the eye-empty areas, thus inhibiting an undesired increase of the series resistance of the heterojunction field effect transistor.

Figure 6:
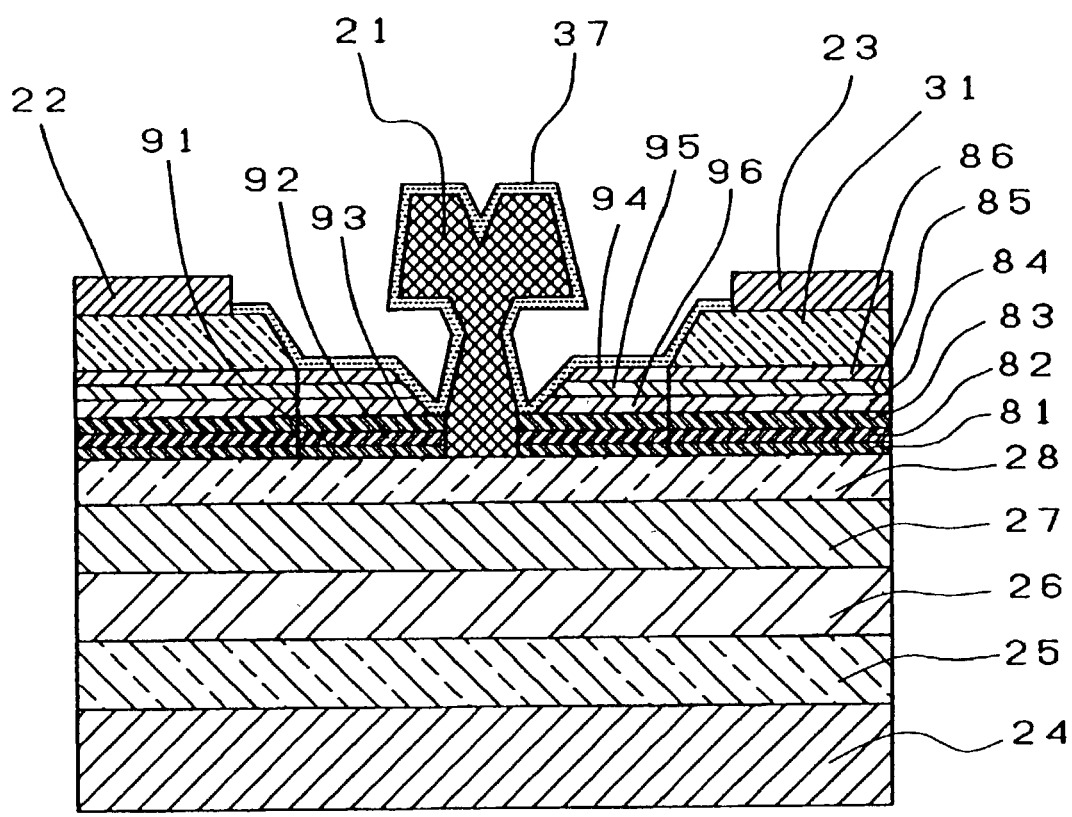
FIG. 6 is a cross sectional view showing a heterojunction field effect transistor formed according to a fifth embodiment of the present invention.
Figure 7:
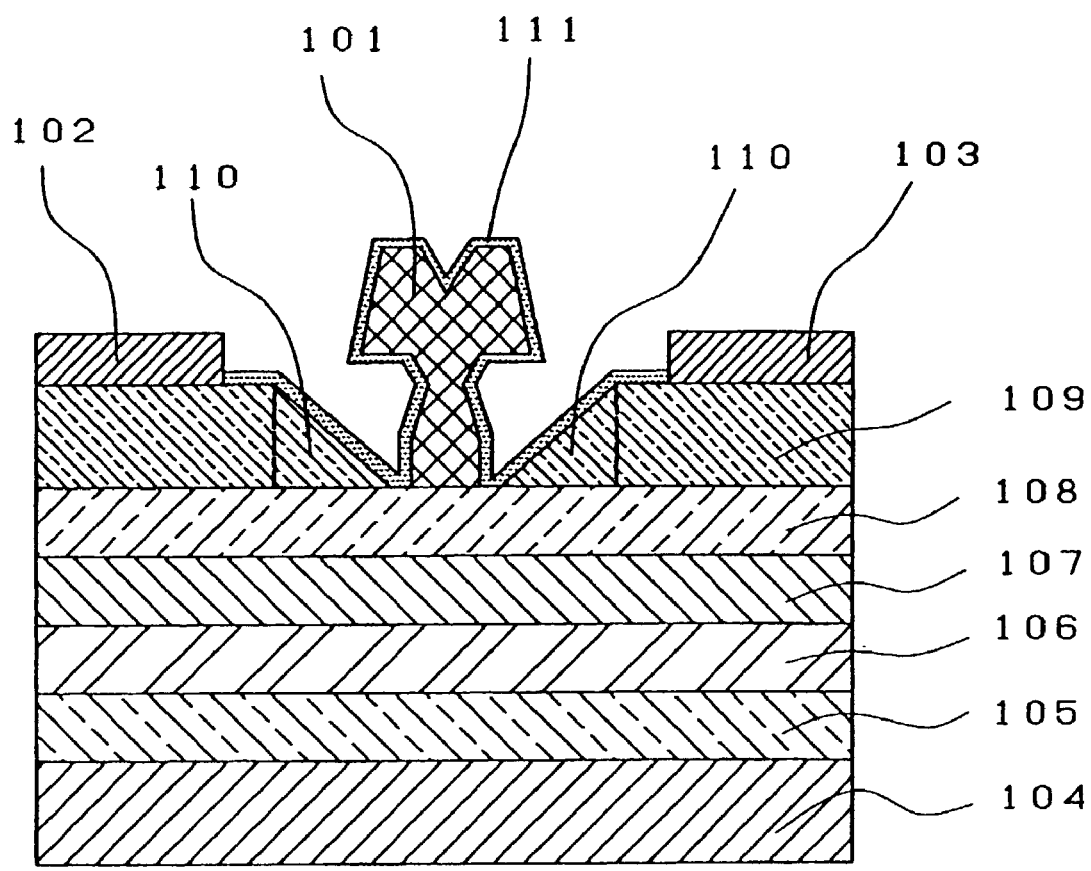
FIG. 7 is a cross sectional view showing a conventional heterojunction field effect transistor having a one-step recess structure.

[Fifth Embodiment, FIG. 6]

In the following, description will be given to explain a heterojunction field effect transistor formed according to a fifth embodiment of the present invention, with reference to FIG. 6.

As shown in FIG. 6, a heterojunction field effect transistor of the fifth embodiment is almost the same as the heterojunction field effect transistor formed according to the fourth embodiment, except that the eye-empty areas have a six-layer structure. Referring again to FIG. 6, the eye-empty areas include a first eye-empty area 91, a second eye-empty area 92, a third eye-empty area 93, a fourth eye-empty area 94, a fifth eye-empty area 95 and a sixth eye-empty area 96. In detail, the first eye-empty area 91 is formed by part of a first connection layer 81 consisting of a low concentration n-type AlGaAs, the second eye-empty area 92 is formed by part of a second connection layer 82 consisting of n-type AlGaAs, the third eye-empty layer 93 is formed by part of a third connection layer 83 consisting of a low concentration n-type AlGaAs, the fourth eye-empty area 94 is formed by part of a fourth connection layer 84 consisting of a low concentration n-type GaAs, the fifth eye-empty layer 95 is formed by part of a fifth connection layer 85 consisting of n-type GaAs, and the sixth eye-empty area 96 is formed by part of a six connection layer 86 consisting of a low concentration n-type GaAs. In this way, a depletion layer occurring in the first eye-empty area 91 is relatively large, a depletion layer occurring in the second eye-empty area 92 is relatively small, a depletion layer occurring in the third eye-empty area 93 is relatively large, and a depletion layer occurring in the fourth eye-empty area 94 is relatively large, a depletion layer occurring in the fifth eye-empty area 95 is relatively small, a depletion layer occurring in the sixth eye-empty area 96 is relatively large. Accordingly, since the shape of the depletion layers of the eye-empty areas in the fifth embodiment involves much more convex and concave portions than the fourth embodiment, it is possible to produce much more portions easy to centralize electric field than the fourth embodiment. Therefore, it is possible to more effectively disperse an electric field, thereby enabling the heterojunction field effect transistor to obtain further improved voltage durability than the above described fourth embodiment.

In the present embodiment, the third eye-empty area 93 and the fourth eye-empty area 94 (which are mutually adjacent to each other) are formed by a low concentration n-type AlGaAs layer and a low concentration n-type GaAs layer, respectively. However, in order for the shape of the surface depletion layer of the third eye-empty area 93 to be different from that of the surface depletion layer of the fourth eye-empty area 94, the impurity concentrations of the low concentration n-type AlGaAs and the low concentration n-type GaAs are preferably different from each other (even if each of them has a low concentration). For instance, it is possible to make any one of the two layers a non-doped layer.

Moreover, since all the corner portions and the gate electrode end portion in the eye-empty areas, on which electric field is centralized by virtue of the two-step recess structure), are formed by layers each having a low impurity concentration, it is possible to more effectively prevent the centralization of electric field than the fourth embodiment, thereby making it possible to ensure an improved voltage durability for the transistor.

Further, when a layer having a high impurity concentration is used in the second eye-empty area 92 as well as in the fifth eye-empty area 95 (both of which belong to the eye-empty areas, but not for centralizing electric field), it is possible to form a high concentration n-type GaAs layer in the eye-empty areas. Therefore, it is possible to inhibit an enlargement of the surface depletion layers of the eye-empty areas, thus inhibiting an increase of the series resistance of the heterojunction field effect transistor.

In the first to fifth embodiments of the present invention, although n-type layers each having a low concentration are used in the eye-empty areas, it is also possible to use non-doped layers containing almost no impurities. Further, in the first to fifth embodiments of the present invention, it is also possible to form a dope channel heterojunction field effect transistor whose barrier layer is in one-layer structure and is formed by a non-doped layer.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed:

1. A heterojunction field effect transistor having a one-step gate recess structure comprising:
    a gate electrode;
    a barrier layer;
    a recess adjacent the gate electrode; and
    a contact layer,
    wherein eye-empty areas extend in a lateral direction of the gate electrode from opposing first and second sides of the gate electrode to an upper end of a side wall of the recess, and also extend in a transverse direction of the gate electrode from a low end of the gate electrode to an upper end of the contact layer, the eye-empty areas being formed by at least three material layers having different impurity concentrations, the gate electrode being formed on the barrier layer and a part of the gate electrode being attached to a part of the eye-empty areas and wherein the at least three material layers forming the eye-empty areas have a plurality of corner portions centralizing electric fields which are formed by using a low impurity concentration layer or a non-doped layer.

2. A heterojunction field effect transistor according to claim 1, wherein the eye-empty areas extend between the first side of the gate electrode and a source electrode and also extend between the second side of the gate electrode and a drain electrode.

3. A heterojunction field effect transistor having a two-step gate recess structure comprising:
    a gate electrode;
    a barrier layer;
    a first recess adjacent a first side of the gate electrode and a second recess adjacent the first recess; and
    a contact layer,
    wherein eye-empty areas extend in a lateral direction of the gate electrode from opposing first and second sides of the gate electrode to a lower end of a side wall of the first recess, and also extend in a transverse direction of the gate electrode from a low end of the gate electrode to a bottom of the first recess, the eye-empty areas being formed by at least three material layers having different impurity concentrations, the gate electrode being formed on the barrier layer and a part of the gate electrode being attached to a part of the eye-empty areas and wherein the at least three material layers forming the eye-empty areas have a plurality of corner portions centralizing electric fields which are formed by using a low impurity concentration layer or a non-doped layer.

4. A heterojunction field effect transistor according to claim 3, wherein the eye-empty areas extend between the first side of the gate electrode and a source electrode and also extend between the second side of the gate electrode and a drain electrode.

5. A heterojunction field effect transistor according to any one of claims 1–4, wherein at least one of the at least three material layers forming the eye-empty areas and having different impurity concentrations is a low impurity concentration layer or a non-doped layer.

6. A heterojunction field effect transistor according to any one of claims 1–4, wherein the at least three material layers forming the eye-empty areas and having different impurity concentrations are formed into a multi-layered structure including a low impurity concentration layer or a non-doped layer and an n-type layer.

7. A heterojunction field effect transistor according to any one of claims 1–4, wherein the at least three material layers forming the eye-empty areas and having different impurity concentrations are formed into a multi-layered structure including a low impurity concentration layer or a non-doped layer and a layer having a high impurity concentration.

8. A heterojunction field effect transistor according to any one of claims 1–4, wherein the at least three material layers forming the eye-empty areas and having different impurity concentrations are formed by GaAs.

9. A heterojunction field effect transistor according to any one of claims 1–4, wherein the at least three material layers forming the eye-empty areas and having different impurity concentrations are formed into a multi-layered structure including GaAs and GaAs.

10. A heterojunction field effect transistor according to any one of claims 1–4, wherein the field effect transistor having the eye-empty areas is a dope channel heterojunction field effect transistor.

* * * * *